United States Patent [19]
Schirmer et al.

[11] Patent Number: 5,969,927
[45] Date of Patent: Oct. 19, 1999

[54] INTEGRATED OVERLOAD PROTECTIVE DEVICE

[75] Inventors: Guenter Schirmer, Reutlingen; Frank Werner, Pfullingen; Hans Raub, Reutlingen, all of Germany

[73] Assignee: Robert Bosch GmbH, Stuttgart, Germany

[21] Appl. No.: 08/956,834

[22] Filed: Oct. 23, 1997

[30] Foreign Application Priority Data

Oct. 24, 1996 [DE] Germany .................. 196 44 193

[51] Int. Cl.$^6$ .................................................. H02H 5/04
[52] U.S. Cl. ............................................................ 361/103
[58] Field of Search ............................. 361/57, 88, 89, 361/93, 94, 103, 97–101; 330/289; 327/513; 232/313–317, 907

[56] References Cited

U.S. PATENT DOCUMENTS

| | | | |
|---|---|---|---|
| 5,039,878 | 8/1991 | Armstrong et al. | 327/512 |
| 5,208,611 | 5/1993 | Kappel et al. | 347/58 |
| 5,726,481 | 3/1998 | Moody | 257/467 |
| 5,737,170 | 4/1998 | Moyer | 361/103 |

OTHER PUBLICATIONS

F. Zantis, "Schutz von Leistungshalbleitern bei der Ansteuerung externer Lasten", Elektor, Apr. 1993, pp. 41–48.

*Primary Examiner*—Ronald W. Leja
*Attorney, Agent, or Firm*—Kenyon & Kenyon

[57] ABSTRACT

An overload protective device for integrated components that responds rapidly to transient local temperature increases to protect the respective component from overload or overheating. The protective device includes an ohmic measuring resistor made of metal, aluminum in particular, that is integrated into the component. Temperature increases and power loss in individual transistor cells can thus be detected reliably.

12 Claims, 3 Drawing Sheets

INTEGRATED OVERLOAD PROTECTIVE DEVICE

BACKGROUND INFORMATION

The article "Schutz von Leistungshalbleitern bei der Ansteuerung externer Lasten" ("Protecting power semiconductors in controlling external loads") by F. P. Zantis in the journal Elektor, April, 1993, pp. 41–48, describes an overload protective device having an ohmic resistor as a temperature sensor, but the close linking of the temperature sensor with the power transistor to be protected consists only of mounting both on a common heat sink.

SUMMARY OF THE INVENTION

The protective device according to the present invention is advantageous in that, e.g., a protection of power transistors from thermal destruction can be assured with a greater reliability. An abnormal increase in temperature is detected with an improved sensitivity, and at the same time the temperature sensor is electrically insulated from the component to be protected. Thus, the temperature sensor is protected at the same time from, e.g., any negative substrate voltages.

When a measuring resistor is designed as a metal strip, a large area of lateral coverage of the integrated component to be protected with the temperature sensor is also possible.

In particular, when the measuring resistor is arranged less than five micrometers away from the thermally stressed semiconductor region, very high transient dissipated power that leads to high local heating in the microsecond range can be recorded reliably and destruction of the component can be prevented.

A meandering arrangement of the measuring resistor around rows of transistor cells detects possible abnormal local temperature increases in a further advantageous manner.

An arrangement of the measuring resistor between the gate layer of a MOS power transistor and a layer of metal above that (serving as a joint source terminal) provides an intimate thermal contact of the measuring resistor with the thermally stressed semiconductor region beyond any possibilities of dissipation of heat over large-area terminals.

An associated analyzer circuit having a reference resistor subject to the same manufacturing tolerances as the measuring resistor provides a reduction in the influence of manufacturing tolerances in establishing a cut-off threshold.

In addition, with a simplified circuit arrangement according to the present invention, it is possible to record relative changes in temperature, in particular, transient high dissipated power mostly independently of manufacturing tolerances.

An improved analyzer circuit according to the present invention not only permits simple and reliable recording of transient relative temperature changes but also makes it possible to easily measure an absolute temperature. This improved analyzer circuit avoids the disadvantageous previously required chip balancing, in particular, a balancing of current sources that would otherwise be necessary. Regardless of manufacturing tolerances, the absolute temperature can be determined, i.e., the component can be turned off with the protective device according to the present invention even with static heating of the entire component or the entire chip.

This improved analyzer circuit according to the present invention has a circuit component that supplies a current that is independent of temperature but depends on the reference resistor. This circuit component can be advantageously designed as a ring current source. One advantage of the ring current source is that suitable current values can be obtained with small values of a few hundred ohms of the metallic resistors used for the reference resistor and the measuring resistor and with only very small voltages of less than a hundred millivolts, which can be adjusted easily by the number of emitters of the output transistor with a ring current source.

DETAILED DESCRIPTION

Figure 1:
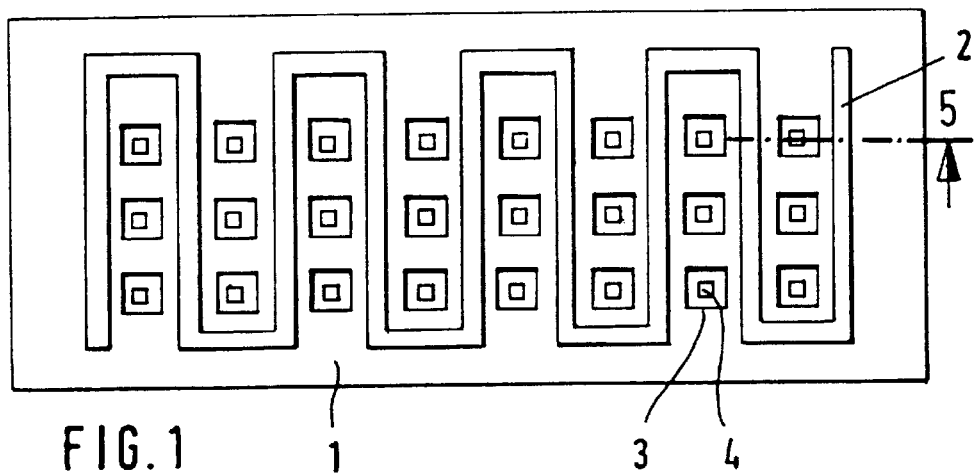
FIG. 1 shows a top view of a MOS power transistor with an integrated measuring resistor made of aluminum.
Figure 2:
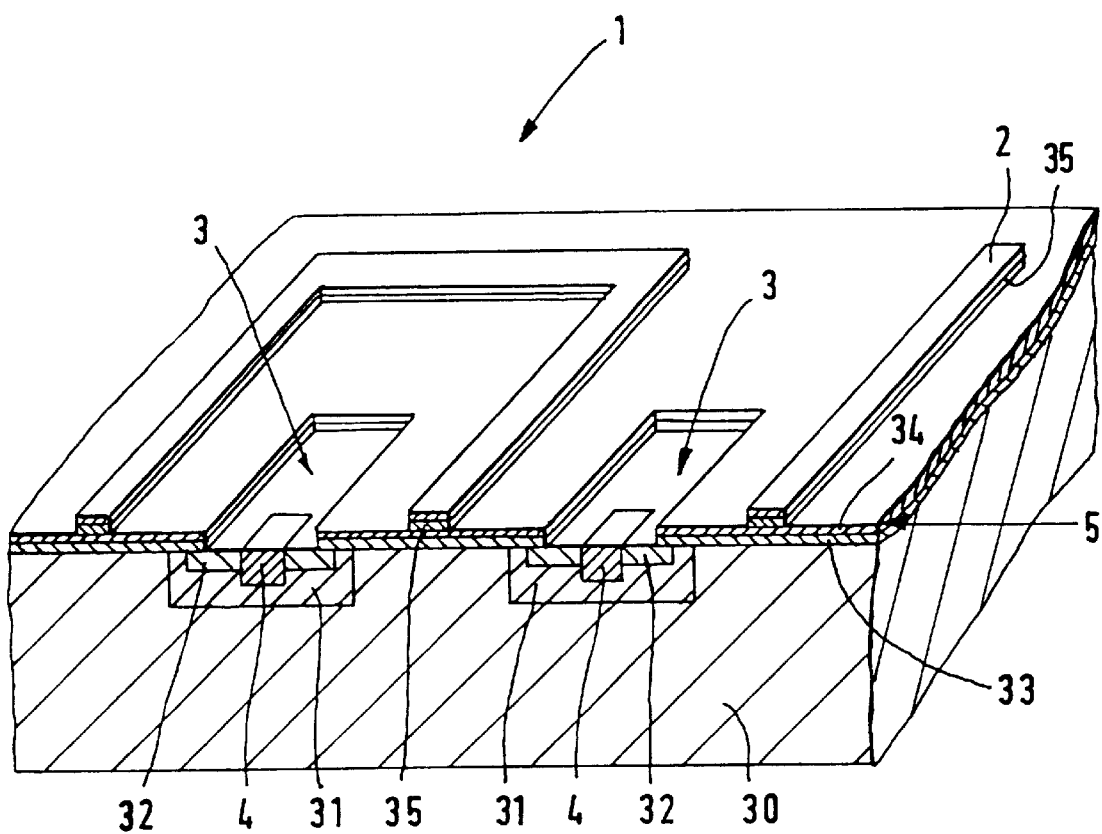
FIG. 2 shows a perspective view of the MOS power transistor illustrated in FIG. 1.

FIG. 1 shows a top view of a MOS transistor 1 having a plurality of transistor cells 3, each of which shows associated source region 4. FIG. 1 does not illustrate the contacting of the individual source regions or other contacts of the MOS transistor. An aluminum strip 2 winds in a meandering arrangement around the individual rows of transistor cells. A section line 5 indicates the direction along which a cross section through the power transistor is illustrated in FIG. 2. In FIG. 1 (and in FIG. 2), the drain region and the respective terminals have been omitted from FIG. 1 for the sake of simplicity. In particular, an upper metal layer that is applied so that it is electrically insulated from aluminum strip 2 and serves for contacting the source regions is also not shown. The meandering form of the aluminum strip guarantees an intimate thermal contact with the individual transistor cells 3, thus a rapid response to abnormal local temperature increases.

FIG. 2 shows a perspective cross-sectional view of the power transistor with an integrated aluminum strip as illustrated in FIG. 1. P-doped troughs 31 are embedded in an n-doped semiconductor region 30, and the source region 4 is embedded in the P-doped troughs 31. Source region 4 is surrounded by highly n-doped regions 32. A gate oxide layer 33 is applied on the surface of semiconductor region 30, and a polysilicon gate layer 34 is deposited on gate oxide layer 33. The source regions 4 of individual transistor cells 3 are not covered by gate oxide layer 33 or by polysilicon gate layer 34. Aluminum strip 2, which meanders around the individual rows of transistor cells 3, is situated on polysilicon gate layer 34.

Aluminum strip 2 is insulated from polysilicon gate layer 34 by an oxide interlayer 35. Oxide interlayer 35 typically has a thickness of approximately one micrometer. The distance between a measuring resistor, designed as aluminum strip 2, and the thermally stressed part of semiconductor region 30 near the surface is less than five micrometers to ensure an optimum thermal coupling. A top metal layer (not shown in FIG. 2) serves as a common source terminal for all the transistor cells of the power transistor is arranged above aluminum strip 2 and is electrically insulated from aluminum strip 2. Individual source regions 4 are contacted with the top metal layer by locally limited metal platings, which are electrically connected to the top metal layer by through-plated holes. Embodiments of the contacting of the individual source regions may vary. It is preferable for aluminum strip 2 to be as close as possible to thermally stressed semiconductor region 30. Thus, the common source terminal of all transistor cells is on the opposite side of aluminum strip 2, as seen from semiconductor region 30.

Figure 3:
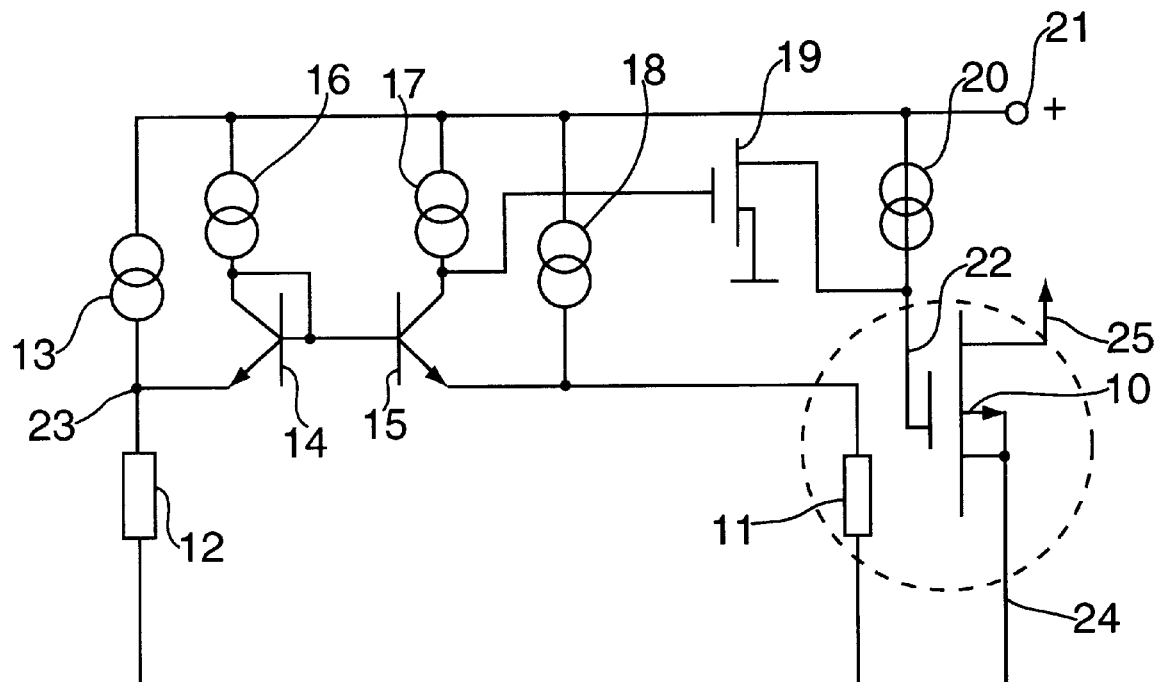
FIG. 3 shows an analyzer circuit according to the present invention.

FIG. 3 shows an analyzer circuit according to the present invention being a part of aluminum strip 2 which serves as measuring resistor 11. A reference current source 13 supplies a current to a reference resistor 12. A reference transistor 14, which is wired as a transistor diode, and a control transistor 15 are wired together with a transistor diode current source 16 as the current mirror. The collector of control transistor 15 is connected to the positive pole 21 of a voltage supply via a control current source 17. Likewise, reference current source 13 and transistor diode current source 16 are connected to the positive pole of the voltage supply. The emitter of reference transistor 14 is connected to a node 23 between reference current source 13 and reference resistor 12, so the voltage drop at reference resistor 12 determines the potential of the emitter of reference transistor 14. A measuring current source 18 is connected in parallel with control current source 17 and the collector-emitter path of control transistor 15. The emitter of control transistor 15 is connected to a ground terminal across measuring resistor 11, which is in the immediate vicinity of thermally stressed semiconductor region 30; likewise, the emitter of reference transistor 14 is connected to ground across reference resistor 12. A cut-off transistor 19 is driven by the collector potential of control transistor 15. Cut-off transistor 19 is connected to ground and to the control input (gate) of the power transistor to be protected, in particular DMOS transistor 10.

Control of same, which is determined by the use of transistor 10, is symbolized by a current source 20 having one terminal at positive pole 21 of the voltage supply. The remaining wiring of transistor 10 at its other terminals 24 and 25 is determined by the respective application.

The current mirror, including transistor diode current source 16, reference transistor 14 and control transistor 15, forms a comparator together with control current source 17. The comparator compares the voltage drop at reference resistor 12 with the voltage drop at measuring resistor 11. The current supplied by control current source 17 and transistor diode current source 16 is small in comparison with the current of measuring current source 18. Therefore, the voltages dropping at reference resistor 12 and at measuring resistor 11 are determined essentially by the current of reference current source 13 and the current of measuring current source 18, respectively. A suitable choice of the resistance values of reference resistor 12 and measuring resistor 11 and a suitable choice of current sources 13 and 18 determines that, in normal operation, the voltage drop at measuring resistor 11 is smaller than the voltage drop at reference resistor 12. Under these conditions, the gate of cut-off transistor 19 is discharged so that cut-off transistor 19 is blocking. Then, if the temperature of transistor 10 rises above a critical level, which is determined by the precise choice of resistance values or current values of the current sources used, the voltage drop at measuring resistor 11 exceeds the voltage drop at resistor 12. Thus, the gate of the cut-off transistor is positively charged. Therefore, cut-off transistor 19 is switched to the conducting state, and short-circuits drive circuit 20 of power transistor 10 to ground, and in this way it shuts down the load current flowing across terminals 24 and 25 which has caused the unwanted overheating.

The advantage of this circuit in conjunction with measuring resistor 11, which is described above with reference to FIGS. 1 and 2, is the reliable detection of rapid local temperature increases due to transient currents as high as 5 to 10 amperes; the temperature may rise by 300 Kelvin within a period of only 5 to 10 microseconds. The resistance of the aluminum strip typically has values on the order of 200 ohms. Transistor diode current source 16 and control current source 17 supply currents on the order of 10 microamperes. The reference current supplied by reference current source 13 is approximately ten times greater than the current of transistor diode current source 16 or control current source 17. Reference resistor 12 and measuring resistor 11 are each made of the same material (e.g., aluminum) and are applied in the same manufacturing step. Thus, both are subject to the same manufacturing tolerances. If the same resistance value is selected for the reference resistor as for the measuring resistor, measuring current source 18 must supply a smaller current than reference current source 13 to guarantee the operation described above.

The analyzer circuit according to the present invention reduces (but does not completely suppress) the influence of manufacturing tolerances on the operating point, because the manufacturing tolerances of the reference resistor and the measuring resistor have no effect only when the resistance values of the reference resistor and the measuring resistor are exactly the same and when the current values of reference current source 13 and measuring current source 18 are exactly the same, even if it is ensured that the reference resistor and measuring resistor are always subject to the same manufacturing tolerance. For example, if reference resistor 12 and measuring resistor 11 differ in their resistance values, a change in temperature will cause different changes in voltage drop at the respective resistor, even if the two resistors are subject to the same percentage manufacturing tolerance. This is of no interest if only very high relative changes in temperature within short periods of time are to be detected. In such cases, it is also irrelevant if reference resistor 12 heats up somewhat, even if it is located a distance away from thermally stressed semiconductor region 30. However, if the protective device is to react quickly not only to relative local temperature changes but also to static heating of the entire semiconductor component, the resistance of the reference resistor must be equal to that of the measuring resistor.

Figure 4:
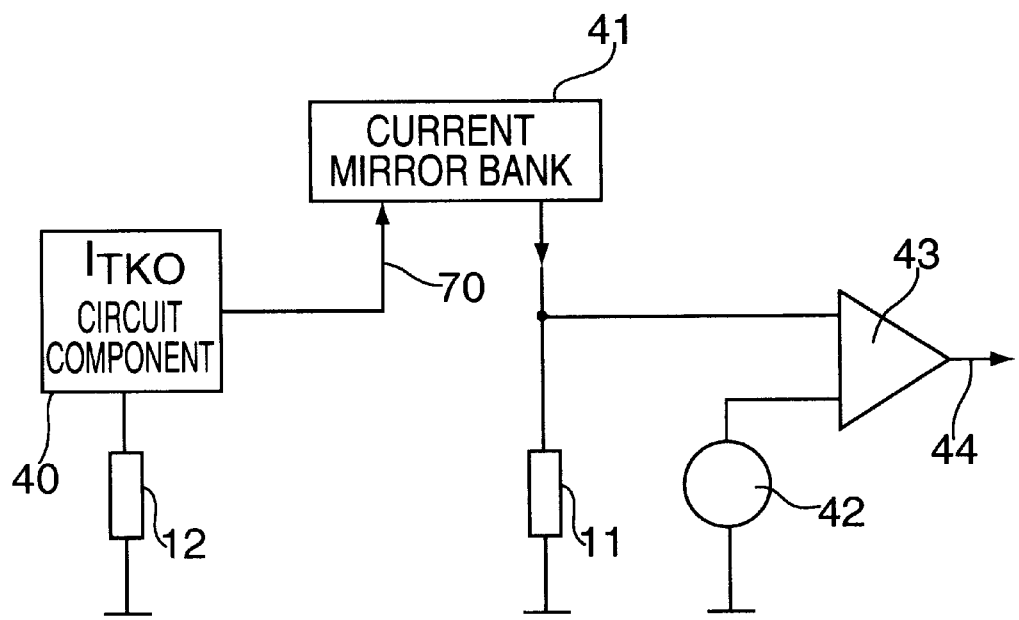
FIG. 4 shows a block diagram of the analyzer circuit according to the present invention.
Figure 6:
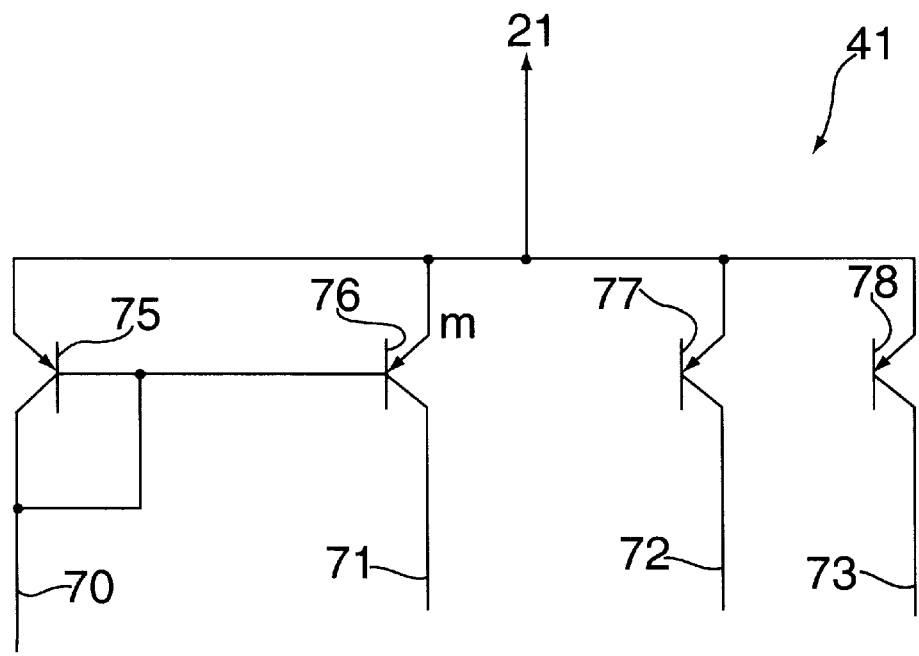
FIG. 6 shows a current mirror bank used in the analyzer circuit illustrated in FIG. 5.

The current values of reference current source 13 and measuring current source 18 should be the same. Then, as an expedient, a lead resistor is necessary between node 23 and the emitter of reference transistor 14 to ensure that in normal operation the voltage drop at measuring resistor 11 will be lower than the sum of the voltage drops occurring at the lead resistor and the reference resistor. In this embodiment of the analyzer circuit according to the present invention, this sum is the relevant reference voltage for an operating point for shut-down of the power transistor due to overheating. So that no manufacturing tolerances can occur with regard to the shutdown threshold, the lead resistor must be made of the same material as the reference resistor and the measuring resistor. In the case of aluminum, (shown, e.g., in the embodiment of FIGS. 1 and 2), a considerable demand for space is required. This space requirement can be circumvented by an improved analyzer circuit according to the present invention, as shown in FIGS. 4 and 6. Another possible disadvantage of the circuit shown in FIG. 3 is its tendency to oscillate. This tendency to oscillate is insignificant in many applications, but for cases where it is important, those skilled in the art will know of measures for eliminating this tendency to oscillate (e.g., by installing time delay elements).

FIG. 4 shows a block diagram of another embodiment of the analyzer circuit according to the present invention with an $I_{TKO}$ circuit component 40 connected to ground across reference resistor 12. $I_{TKO}$ circuit component 40 is connected to the input of a current mirror bank 41. The at least one output of current mirror bank 41 is connected to ground across measuring resistor 11. The voltage drop at measuring resistor 11 is sent to one input of comparator 43. The second input of comparator 43 receives the reference voltage from a $U_v$ circuit component. Output signal 44 of the comparator is used to drive the cut-off transistor.

$I_{TKO}$ circuit component 40 generates a temperature-independent current, the size of which varies with the process-related tolerance (e.g., ±20%) in reference resistor 12 which is made of aluminum; the current is inversely proportional to the resistance value of reference resistor 12. A temperature-independent reference voltage is supplied by a circuit component 42. The current generated by circuit component 40 is mirrored via current mirror bank 41 onto measuring resistor 11, whose value fluctuates like the value of reference resistor 12. The measuring circuit voltage at measuring resistor 11 is thus independent of the absolute tolerance (in the resistances) of the metal resistors. The voltage drop at measuring resistor 11 is the product of a current proportional to the temperature-independent current supplied by circuit component 40 multiplied by the temperature-dependent resistance value of measuring resistor 11, i.e., the voltage drop at measuring resistor 11 is proportional to the quotient of the temperature-dependent measuring resistor with the reference resistor. There is a linear relationship between 11 measuring resistor and the temperature and thus a linear temperature dependence of the measuring circuit voltage. The measuring circuit voltage is compared in comparator 43 with the reference voltage, which is also supplied by circuit component 42 independently of temperature. If the value of the reference voltage is exceeded, a corresponding output signal 44 of the comparator supplies the necessary information to the cut-off transistor to isolate the control of the power transistor from that of the power transistor which has become too hot.

Figure 5:
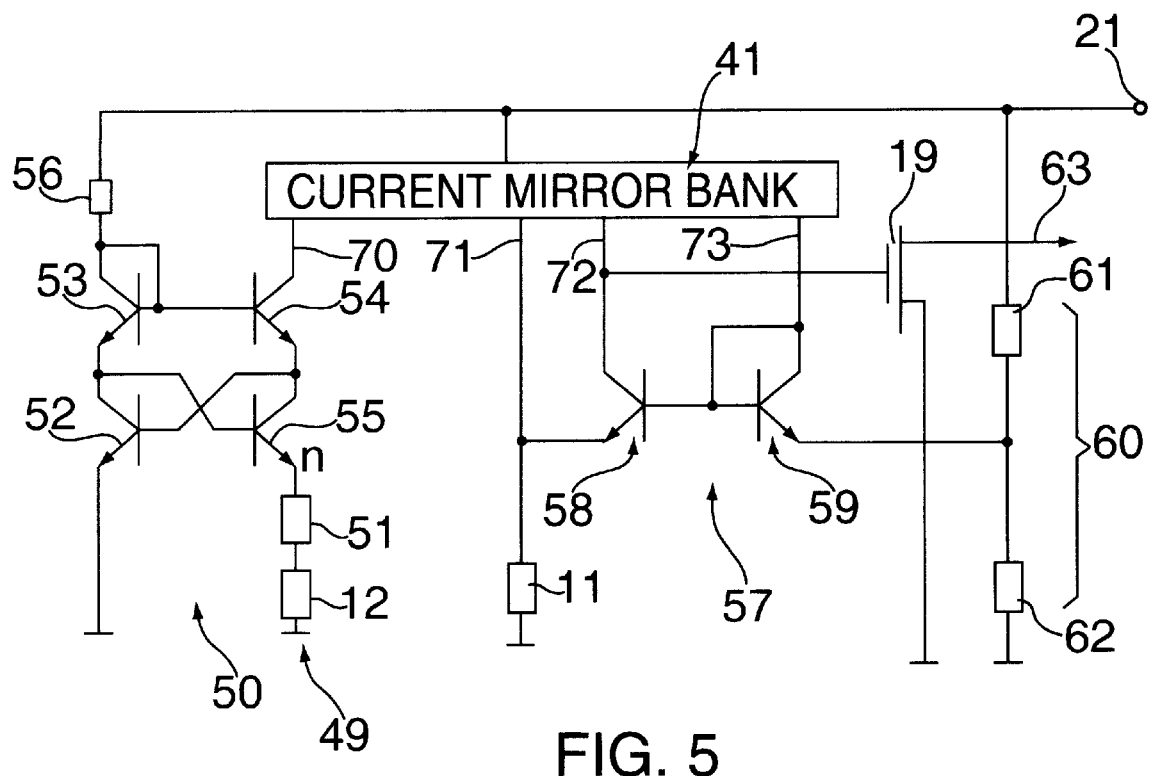
FIG. 5 shows an exemplary embodiment of the analyzer circuit illustrated in FIG. 4.

FIG. 5 shows an examplary implementation of an analyzer circuit according to the present invention as described above with respect to FIG. 4. Transistors 52, 53, 54 and 55 as well as a resistor 56, reference resistor 12 and a compensation resistor 51 are wired as a ring current source 50. Output transistor 55 with a number of emitters is connected to ground across compensation resistor 51 and reference resistor 12. Transistor 54, transistor 55, and reference resistor 12 as well as compensation resistor 51 form output current path 49 of ring current source 50. Transistor 53, which is wired as a transistor diode, is connected to positive pole 21 of the voltage supply across resistor 56. The collector of transistor 54 is connected to bank input 70 of current mirror bank 41, which is also connected to the positive pole of the voltage supply. In this embodiment according to the present invention, current mirror bank 41 has three outputs 71, 72 and 73. Output 71 is connected to ground with measuring resistor 11. Bank outputs 72 and 73 are connected to the collectors of transistors 58 and 59, which are wired as current mirror 57. The emitter of transistor 58 picks off the potential at measuring resistor 11. The emitter of transistor 59, which is wired as a transistor diode, is at a reference potential which is defined by a linear voltage divider 60 having voltage divider resistors 61 and 62. The collector of transistor 58 is connected to the gate of cut-off transistor 19. Cut-off transistor output 63 is wired as already illustrated in FIG. 3.

The design of current mirror bank 41 is shown in FIG. 6. The current mirror bank is an enlarged current mirror circuit with three bank outputs 71, 72 and 73. Bank input 70 is formed by the collector terminal of bank transistor 75, which is wired as a transistor diode. The other bank transistors 76, 77 and 78 are wired with their base-emitter junctions in parallel with the base-emitter junction of bank transistor 75, where bank transistor 76 has an emitter number m, m is typically being between 1 and 10. In a further embodiment with MOSFET transistors, similar operation is ensured by a suitable choice of the channel width of transistor 76 relative to the channel width of the remaining transistors of current mirror bank 41. Emitter number m, where $1<m \leq 10$, guarantees that the current flowing through bank output 71 is much larger than the current flowing through bank outputs 72 and 73. Ring current source 50 corresponds to circuit component 40, which supplies a temperature-independent current that is inversely proportional to the resistance value of reference resistor 12 into bank input 70 of current mirror bank 41. This temperature-independent current is mirrored into measuring resistor 11 via bank output 71. Current mirror 57 connected to bank outputs 72 and 73 serves as comparator 43, comparing the voltage drop at measuring resistor 11 with the reference voltage supplied by linear voltage divider 60 and applied to the emitter of transistor 59. The operating point of the protective equipment is set by linear voltage divider 60 and is independent of temperature. If the voltage drop at measuring resistor 11 exceeds the reference voltage, cut-off transistor 19 becomes active as in the method described in FIG. 3. As already described, a lead resistor, which may be necessary in FIG. 3 and which is associated with a large surface area needed, is not necessary using this embodiment of the analyzer circuit according to the present invention. Furthermore, chip balancing is no longer necessary. Current sources that would have to be balanced are no longer present. The current flowing through bank outputs 72 and 73 is small in comparison with the current from bank output 71. Thus, the voltage drop at reference resistor 11 and at voltage divider resistor 62 is determined only by the current flowing through bank output 71 and by the voltage divider ratio of voltage divider 60. This circuit ensures that the measuring circuit voltage at resistor 11 has a certain constant value for a given temperature regardless of manufacturing tolerances of the aluminum resistors. This permits an absolute temperature measurement. Measuring resistor 12 and reference resistor 11 are preferably made of aluminum.

In addition to the choice of the voltage divider ratio of voltage divider 60, the operating point for the protective device can be varied easily through the number m of emitters of bank transistor 76. The current in output current path 49 of ring current source 50 is calculated as the product of the logarithm of the number n of emitters of output transistor 55 multiplied by the quotient of the thermal voltage with the sum of reference and compensation resistance. The thermal voltage is equal to $$\frac{k \cdot T}{e}.$$

The compensation resistor is selected to be small in comparison with the reference resistor and has a smaller temperature coefficient than the reference resistor. Therefore, polysilicon is an advantageous material choice for the compensation resistor. The compensation resistor reduces the slight overcompensation of the temperature-dependence of the thermal voltage due to the temperature-dependence of the reference resistor. Since the compensation resistor has a smaller temperature coefficient than the reference resistor, the compensation resistor lowers the temperature coefficient of the sum of the resistances of the compensation resistor and the reference resistor in comparison with the temperature coefficient of the reference resistor. Therefore, the temperature coefficient of the sum of resistances of the compensation resistor and the reference resistor approaches the temperature coefficient of the thermal voltage, and the current in the output current path of ring current source 50 can be designed independently of temperature for use to an adequate extent.

The protective device illustrated in FIG. 5 is a universal protective device that responds equally to transient local high power losses as well as to overall heating of the semiconductor component to be protected, and thus it protects the semiconductor component from all conceivable forms of overheating.

What is claimed is:

1. An overload protective device, comprising:
   an integrated component;
   a temperature sensor including an ohmic measuring resistor, the ohmic measuring resistor being integrated into the integrated component and being electrically insulated;
   an oxide interlayer; and
   a gate layer of a MOS power transistor, the MOS power transistor including transistor cells,
   wherein the ohmic measuring resistor is arranged on the gate layer and is insulated from the gate layer by the oxide interlayer, the ohmic measuring resistor being arranged in a meandering pattern around rows of the transistor cells, and
   wherein the ohmic measuring resistor is arranged between the gate layer and a metal layer, the metal layer being a source terminal for source regions.

2. The protective device according to claim 1, wherein the ohmic measuring resistor includes a metal strip arranged in a strip pattern.

3. The protective device according to claim 1, wherein the ohmic measuring resistor is arranged at a predetermined distance from a thermally stressed semiconductor region, the predetermined distance being less than five micrometers.

4. The protective device according to claim 1, further comprising:
   at least one analyzer circuit having a reference voltage, wherein the ohmic measuring resistor has a voltage drop corresponding to a thermal stress on the integrated component, the voltage drop being comparable with the reference voltage; and
   a cut-off transistor cutting off a heat-producing current flow flowing through the integrated component conducting when the heat-producing current flow generates a reference value corresponding the reference voltage,
   wherein the at least one analyzer circuit includes a reference resistor usable as a joint component of the at least one analyzer circuit,
   wherein the at least one analyzer circuit is assigned to at least one of the integrated component and a further component, and is manufactured with a first tolerance, and
   wherein the ohmic measuring resistor is manufactured with a second tolerance, the second tolerance being equal to the first tolerance.

5. The protective device according to claim 4, wherein the at least one analyzer circuit is integrated into the integrated component.

6. The protective device according to claim 1, wherein the integrated component includes a DMOS power transistor.

7. The protective device according to claim 1, wherein the ohmic measuring resistor is composed of an aluminum material.

8. An overload protective device comprising:
   an integrated component;
   a temperature sensor including an ohmic measuring resistor, the ohmic measuring resistor being integrated into the integrated component and being electrically insulated;
   at least one analyzer circuit having a reference voltage, wherein the ohmic measuring resistor has a voltage drop corresponding to a thermal stress on the integrated component, the voltage drop being comparable with the reference voltage;
   a cut-off transistor cutting off a heat-producing current flow flowing through the integrated component conducting when the heat-producing current flow generates a reference value corresponding the reference voltage,
      wherein the at least one analyzer circuit includes a reference resistor usable as a joint component of the at least one analyzer circuit,
      wherein the at least one analyzer circuit is assigned to at least one of the integrated component and a further component, and is manufactured with a first tolerance,
      wherein the ohmic measuring resistor is manufactured with a second tolerance, the second tolerance being equal to the first tolerance, and
      wherein the at least one analyzer circuit includes a reference transistor configured as a transistor diode and a control transistor,
   a transistor diode current source arranged with the transistor diode and the control transistor to form a current mirror;
   a reference current source coupled in parallel with the transistor diode current source and the transistor diode, the transistor diode including an emitter coupled to a ground via the reference resistor;
   a control current source coupled between a collector of the control transistor and a positive pole of a voltage source;
   a measuring current source coupled in parallel with a series connection of the control current source and the control transistor; and
   a drive circuit,
      wherein an emitter of the control transistor is coupled to the ground via the measuring resistor, the collector of the control transistor being coupled to a gate terminal of the cut-off transistor, and
      wherein the cut-off transistor is configured as an n-channel MOSFET transistor, the cut-off transistor having a source terminal coupled to the ground, and having a drain terminal coupled to a control input of the integrated component, the control input of the integrated component being coupled to the positive pole of the voltage source via the drive circuit.

9. An overload protective device comprising:
   an integrated component;
   a temperature sensor including an ohmic measuring resistor, the ohmic measuring resistor being integrated into the integrated component and being electrically insulated;

at least one analyzer circuit having a reference voltage, wherein the ohmic measuring resistor has a voltage drop corresponding to a thermal stress on the integrated component, the voltage drop being comparable with the reference voltage;

a cut-off transistor cutting off a heat-producing current flow flowing through the integrated component conducting when the heat-producing current flow generates a reference value corresponding the reference voltage, wherein the at least one analyzer circuit includes a reference resistor usable as a joint component of the at least one analyzer circuit, wherein the at least one analyzer circuit is assigned to at least one of the integrated component and a further component and is manufactured with a first tolerance, wherein the ohmic measuring resistor is manufactured with a second tolerance, the second tolerance being equal to the first tolerance, wherein the at least one analyzer circuit includes a circuit component, a current mirror bank and a comparator, the current mirror bank including a bank input and at least one bank output, the bank input receiving a substantially temperature-independent current from the circuit component in an inverse proportion to the reference resistor, wherein the temperature-independent current is provided over the at least one bank output to a current path coupled to the ohmic measuring resistor, the voltage drop at the ohmic measuring resistor being provided to a first input port of the comparator, the reference voltage being provided to a second input port of the comparator, and wherein the cut-off transistor is controlled by using an output signal of the comparator.

10. The protective device according to claim 9, wherein the circuit component includes a ring current source having an output current path, and wherein the reference resistor and a compensation resistor are coupled in series and are situated in the output current path.

11. The protective device according to claim 9, wherein the comparator includes two transistors wired as current mirror devices, the two transistors being coupled to two further outputs of the current mirror bank.

12. The protective device according to claim 9, further comprising:

a linear voltage divider determining the reference voltage.

* * * * *